United States Patent [19]

Schuster

[11] Patent Number: 5,068,510

[45] Date of Patent: Nov. 26, 1991

[54] SOLDERING MEANS WHICH HAS AT LEAST ONE STIRRUP ELECTRODE WHICH CAN BE HEATED BY ELECTRICAL RESISTANCE

[75] Inventor: Rudolf Schuster, Heimstetten, Fed. Rep. of Germany

[73] Assignee: Siemens Aktiengesellschaft, Munich, Fed. Rep. of Germany

[21] Appl. No.: 506,922

[22] Filed: Apr. 10, 1990

[30] Foreign Application Priority Data

May 9, 1989 [DE] Fed. Rep. of Germany ....... 3916353

[51] Int. Cl.[5] .......................... B23K 3/03; B23K 35/02
[52] U.S. Cl. .................................. 219/85.16; 219/233
[58] Field of Search ...................... 219/85.16, 229, 230, 219/233; 228/51, 54, 55

[56] References Cited

U.S. PATENT DOCUMENTS

| | | | |
|---|---|---|---|
| 2,012,335 | 8/1935 | Bergen | 219/233 |
| 3,786,228 | 1/1974 | Castellana et al. | 219/233 |
| 4,255,644 | 3/1981 | Delorme | 219/233 |
| 4,412,123 | 10/1983 | Ammann et al. | 219/233 |
| 4,910,383 | 3/1990 | Zimmer | 219/233 |
| 4,912,743 | 3/1990 | Zeltner | 219/85.16 |
| 4,982,890 | 1/1991 | Schuster et al. | 219/85.16 |

FOREIGN PATENT DOCUMENTS

| | | |
|---|---|---|
| 0011046 | 5/1980 | European Pat. Off. . |
| 2818958 | 11/1978 | Fed. Rep. of Germany . |
| 3149236 | 8/1982 | Fed. Rep. of Germany . |

*Primary Examiner*—Geoffrey S. Evans

[57] ABSTRACT

A soldering device comprising at least one strip electrode which can be electrically heated and wherein so as to avoid thermal deformation and to assure good contact between the stirrup electrode (B) and the soldering joint wherein at the outer ends of the soldering strip (Ls) of the stirrup electrode (B) is closed expansion-compensation guards (AK) are provided which are U-shaped and which are attached to the soldering strip (Ls). Vertically extending retaining strips (Hs) are attached to the ends of the expansion-compensation guards (AK) so as to provide soldering which is particularly suitable for soldering high-pole electronic components on a PC board. The two retaining strips (Hs) may be approximately one-half the length of soldering strip.

10 Claims, 1 Drawing Sheet

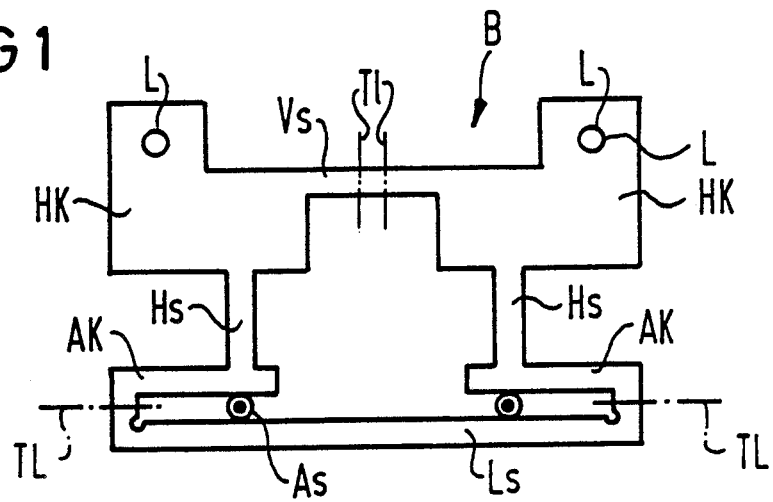
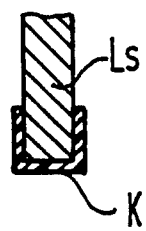
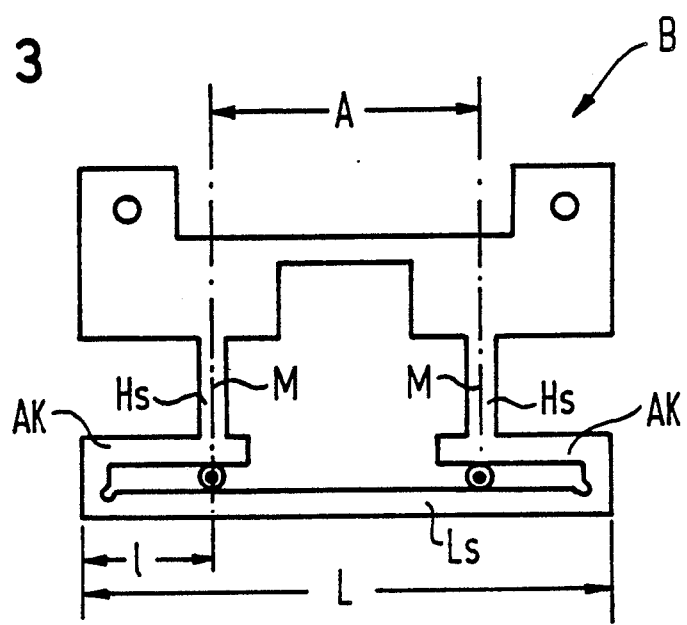

SOLDERING MEANS WHICH HAS AT LEAST ONE STIRRUP ELECTRODE WHICH CAN BE HEATED BY ELECTRICAL RESISTANCE

CROSS-REFERENCE TO RELATED APPLICATION

This application is related to copending application Ser. No. 444,831, entitled "Soldering Means Having At Least One Stirrup Electrode And Two Soldering Webs Lying Opposite One Another or Four Soldering Webs Lying Opposite One Another In Pairs", Rudolf Schuster, assigned to the assignee of the present invention.

BACKGROUND OF THE INVENTION

1. Field of the Invention

This invention relates in general to a soldering means including at least one stirrup electrode that can be heated by electrical resistance and can be used particularly for soldering high-pole electronic components on PC boards.

2. Description of the Related Art

German DE 31 49 236 discloses an electrode holder and soldering means which comprises small columns composed of electrically conducting material which are electrically insulated from each other with at least two stirrup electrodes being fastened in interchangeable fashion between their ends. The U-shaped stirrup electrodes which can be heated by electrical resistance are formed from a flat plate composed of resistive materials such as tandulum or molybdenum and are fastened in a manner so that they come in contact with the elements which are being soldered at their bottom edge of their soldering strip surface. When a plurality such as two or four stirrup electrodes are used together, four small columns are necessary for the electrode holders and the columns are arranged on a respective diagonal of the soldering means and are mechanically connected with each other by several cross-shaped cross-strut diagonal members. The power supply of four strip-shaped electrodes comprise two small columns located on one diagonal which are connected with one pole of a current source and two other small columns are connected to the other pole of the current source.

German DE-A-28 18 958 discloses a different soldering means in which the electrode holder comprises two small columns composed of conductive material which are electrically insulated from each other and between their ends one single strip electrode is fastened. This stirrup electrode comprises a total of four soldering strips which have the shape of one-piece rectangular frame and two oppositely located soldering strips are fastened in an exchangeable manner or extensions on the associated small columns which project toward the top of the device.

European Patent EP-A-O 011 046 discloses another soldering means which has one single stirrup electrode fastened to an electrode holder which has altogether four soldering strips located opposite from each other in pairs and the soldering strips have the shape of a one-piece rectangular frame.

These known soldering means described above are used particularly for soldering high pole electronic components such as micropacks, flatpacks and so on to printed circuit boards and the stirrup electrodes are resistively heated by current pulses. It is necessary before soldering as well as during the entire duration of the soldering that good contact be assured between the operating surfaces of the stirrup electrodes and the contact legs of the components and the inner connections or contact pads of the PC board. However, even if the soldering strips are adjusted so that they are absolutely parallel to the soldering joint this requirement cannot always be assured.

SUMMARY OF THE INVENTION

The invention is based upon the realization that the resistive heating of the stirrup electrode causes thermal expansion of a link of the soldering strip and this thermal expansion causes arching and bending of the soldering strip since it is firmly held by the retaining webs and as a result insufficient contact between the soldering strip and the soldering joint can result. This disadvantage can be eliminated at least in part by using inventive expansion-compensation guards since such expansion compensation guards compensate for the thermal expansion of the length of the soldering strip relative to the retaining webs.

According to a particular preferred embodiment of the soldering means according to the invention, the distance between the two retaining webs is selected to be approximately one-half the length of the soldering strip. With such a design, the force caused by the retaining webs causes controlling couples/moments which are equally large when the soldering strip experiences concave or convex arching of the PC board and, thus, allows an optimal adaptation to unevenness of the PC board in the elastic region of the soldering strip.

Although the links of the sums of the two expansion-compensation guards is less than the length of the soldering strip, full compensation of the thermal length expansion of the soldering strip can be achieved. The cross-section of the expansion-compensation guards can be selected such that a higher temperature due to the resistive heating develops in the guards than in the soldering strip. However, the expansion compensation guards can also be selected to be of a material which has a thermal expansion coefficient which is greater than the thermal expansion coefficient of the material of the soldering strip. These two effects can be combined so as to achieve a complete compensation for the thermally expansion of the soldering strip.

According to another embodiment of the invention, it is possible to use an electrically insulating support arranged between the expansion-compensation guard and the soldering strip in the area of a retaining web. Even with small cross-sections of the expansion-compensation guards, such supports assure that the soldering strip surface would be maintained in contact with the soldering surface.

Another particularly preferred embodiment of the soldering means according to the invention provides that an electrically insulating ceramic coating is applied to the bottom edge of the soldering surface of the stirrup electrode. This ceramic coating makes it possible that current supplied to the stirrup electrode does not leak off of the stirrup electrode by way of low impedance leakage paths. Also, by preventing the arching and bending of the soldering surface, the ceramic coating on the bottom side of the soldering strip surface does not break and fall off the soldering strip.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIG. 1 is a plan view of the stirrup electrode according to the invention;

FIG. 2 is a sectional view of a soldering strip provided with a ceramic coating on its contact edge; and FIG. 3 is a plan view of the stirrup electrode used for explaining the invention.

DESCRIPTION OF THE PREFERRED EMBODIMENTS

FIG. 1 illustrates in plan view a stirrup electrode B which is formed from a flat plate. It includes a soldering strip Ls at its lower edge relative to the FIG. which is placed in contact with the soldering joint and which is lifted off the soldering joint after soldering has been completed. So as to prevent the bending and arching of the soldering strip Ls and to assure good contact between the bottom edge of the soldering strip Ls and the respective soldering joint, at the outer ends of the soldering strip Ls expansion-compensation guard/guides AK are attached to the soldering strip and have a shape as shown. The ends of the soldering strip and the expansion-compensation guards form a U-shaped structure as shown. The inner ends of the expansion-compensation guards/guides AK are connected to retaining element strips Hs which extend upwardly in the vertical direction relative to FIG. 1. At the upper ends of the retaining element strips Hs which extend parallel to each other a fixed distance from each other, the strips Hs are integrally formed with a retaining and contacting member HK. Holes L are formed in the retaining and contacting members HK for supporting the stirrup electrode B in electrode holders, not shown, and also to allow the connection of power supply cables to provide the solder connection. A small connecting strip Vs extends between the retaining and contacting members HK for the left and right ends of the retaining and contacting members HK as shown in FIG. 1 and after production, the connecting strip Vs is cut after the stirrup electrode has been mounted in the holder to remove the portion T1 so that the opposite ends of the solder strip Ls are electrically insulated from each other.

Between the expansion compensation guards/guides AK and the solder strip Ls, electrically insulating supports As are provided as shown. The supports As in an exemplary embodiment may be formed of ceramic pipe-shaped material so as to assure safe introduction of force between the retaining members Hs and the soldering strip Ls.

So as to assure that in the case of specific applications, such as soldering multi-pole components on multi-layer PC board that the current which is supplied to the strip stirrup electrode B in the form of current pulses does not leak off by way of low impedance paths when placed on the soldering joint, the bottom edge of the soldering strip Ls is provided with a ceramic coating K as shown in FIG. 2. The ceramic coating may have a thickness of 75 micrometers, for example. The ceramic coating as shown extends a distance up the side edges of the soldering strip Ls so as to prevent electrical contact being made in the event the electronic components which are being soldered have bent contact legs. A suitable material for the ceramic coating K are titanium oxide, aluminum oxide, aluminum nitride, beryllium oxide, titanium aluminum nitride or chrome oxide.

FIG. 3 illustrates that the distance A between the center lines M of the retaining elements/strips Hs is as shown. The length of the soldering strip Ls is designated L. So as to assure an optical elastic adaptation of the soldering strip Ls to unevenness of the PC board is the distance A, selected to be one-half the length L. With such arrangement equally large offsetting moments are applied to the soldering strip Ls by way of the retaining strips Hs in the case of concave as well as convex bulging or arching of the PC boards.

In the illustrated exemplary embodiment, the length l of the expansion-compensation guards AK is selected to be one-fourth of the length L of the soldering strips Ls as shown in FIG. 3. So as to completely compensate for the thermal length expansion of the soldering strip Ls with the expansion-compensation guards AK, the cross-section of the expansion-compensation guards AK must be designed so that the temperature during soldering in the guards AK is twice as high as the operating temperature in the soldering strip Ls. It is also possible, however, to manufacture the expansion-compensation guards AK from materials which have thermal expansion coefficients which is twice as great as the thermal expansion coefficient of the material of the soldering strips Ls. The soldering strips Ls and the expansion-compensation guards AK are welded together to form one piece structures and to form the illustrate U-shape. The weld occurs at the die dot separating lines TL shown in FIG. 1.

The two different possibilities for completely compensating for the thermal length expansion of the soldering strip can also be combined with each other so that part of the compensation is with one method and the remaining compensation is with the other method. In a particular embodiment of the invention, the soldering strip Ls was composed of a nickel-iron alloy having the following chemical composition (weight percent):

Ni 29
Mn 0.2
Si 0.2
Fe remainder
Co 18
C 0.03

The expansion correction value ($10^{-6}$/K) from 20° to 200° C.: 5.5.

The expansion-compensation guards AK were composed of a nickel iron alloy having the following chemical composition (weight per cent):

Ni 41
Mn 0.5
Si 0.2
Fe remainder
C 0.01 expansion correction value ($10^{-6}$/K) from 20° to 200° C.: 4.3. In this example, the cross-section of the expansion-compensation guard AK is selected so that for a complete compensation of the thermal length expansion of the soldering strip Ls a correspondingly higher temperature results in the expansion compensation guards AK than in the soldering strip Ls. This means that the cross-sectional area of the expansion-compensation guards AK must be smaller than the cross-sectional area of the soldering strips Ls.

Although the invention has been described with respect to preferred embodiments, it is not to be so limited as changes and modifications can be made which are within the full intended scope of the invention as defined by the appended claims.

I claim as my invention:

1. A soldering means comprising at least one stirrup electrode which is subject to electrical resistance heating for soldering high-pole electronic components on PC boards, comprising, a soldering strip (Ls) with outer ends of which faces the joint to be soldered, a pair of expansion-compensation guards (AK) attached to the outer ends of said soldering strip (Ls) and extending toward each other, a pair of retaining elements (Hs) attached to the inner ends of said pair of expansion-compensation guards (AK) and extending in a direction normal to the soldering strip (Ls) and spaced relative to each other a distance (A).

2. A soldering means according to claim 1, wherein the distance (A) between said pair of retaining elements/strips (Hs) is approximately one half the length (L) of the soldering strip (Ls).

3. A soldering means comprising at least one stirrup electrode which is subject to electrical resistance heating for soldering high-pole electronic components on PC boards, comprising, a soldering strip (Ls) with outer ends of which faces the joint to be soldered, a pair of expansion-compensation guards (AK) attached to the outer ends of said soldering strip (Ls) and extending toward each other, a pair of retaining elements (Hs) attached to the inner ends of said pair of expansion-compensation guards (AK) and extending in a direction normal to the soldering strip (Ls) and spaced relative to each other a distance (A), and, wherein the cross-sectional area of said pair of expansion-compensation guards (AK) is such that the resistance heating causes a higher temperature in said guards (AK) than in the soldering strip (Ls).

4. A soldering means according to claim 3, wherein said pair of expansion-compensation guards (AK) are formed of a material which has a higher thermal expansion coefficient than the thermal expansion coefficient of the material of the soldering strip (Ls).

5. A soldering means according to claim 3 characterized in that respectively in the area of one of said pair of retaining strips (Hs) and one of said pair of expansion-compensation guards (AK) and said soldering strip (Ls) an electrically insulating support (As) is provided.

6. A soldering means according to claim 3 wherein an electrically insulating ceramic coating (K) is applied to the bottom side of said soldering strip (Ls) of said stirrup electrode (B).

7. A soldering means comprising at least one stirrup electrode which is subject to electrical resistance heating for soldering high-pole electronic components on PC boards, comprising, a soldering strip (Ls) with outer ends of which faces the joint to be soldered, a pair of expansion-compensation guards (AK) attached to the outer ends of said soldering strip (Ls) and extending toward each other, a pair of retaining elements (Hs) attached to the inner ends of said pair of expansion-compensation guards (AK) and extending in a direction normal to the soldering strip (Ls) and spaced relative to each other a distance (A), wherein the distance (A) between said pair of retaining elements/strips (Hs) is approximately one half the length (L) of the soldering strip (Ls), and wherein the cross-sectional area of said pair of expansion-compensation guards (AK) is such that the resistance heating causes a higher temperature in said guards (AK) than in the soldering strip (Ls).

8. A soldering means comprising at least one stirrup electrode which is subject to electrical resistance heating for soldering high-pole electronic components on PC boards, comprising, a soldering strip (Ls) with outer ends of which faces the joint to be soldered, a pair of expansion-compensation guards (AK) attached to the outer ends of said soldering strip (Ls) and extending toward each other, a pair of retaining elements (Hs) attached to the inner ends of said pair of expansion-compensation guards (AK) and extending in a direction normal to the soldering strip (Ls) and spaced relative to each other a distance (A), and wherein said pair of expansion-compensation guards (AK) are formed of a material which has a higher thermal expansion coefficient than the thermal expansion coefficient of the material of the soldering strip (Ls).

9. A soldering means comprising at least one stirrup electrode which is subject to electrical resistance heating for soldering high-pole electronic components on PC boards, comprising, a soldering strip (Ls) with outer ends of which faces the joint to be soldered, a pair of expansion-compensation guards (AK) attached to the outer ends of said soldering strip (Ls) and extending toward each other, a pair of retaining elements (Hs) attached to the inner ends of said pair of expansion-compensation guards (AK) and extending in a direction (A), and characterized in that respectively in the area of one of said pair of retaining strips (Hs) and one of said pair of expansion-compensation guards (AK) and said soldering strip (Ls) an electrically insulating support (As) is provided.

10. A soldering means comprising at least one stirrup electrode which is subject to electrical resistance heating for soldering high-pole electronic components on PC boards, comprising, a soldering strip (Ls) with outer ends of which faces the joint to be soldered, a pair of expansion-compensation guards (AK) attached to the outer ends of said soldering strip (Ls) and extending toward each other, a pair of retaining elements (Hs) attached to the inner ends of said pair of expansion-compensation guards (AK) and extending in a direction normal to the soldering strip (Ls) and spaced relative to each other a distance (A), and wherein an electrically insulating ceramic coating (K) is applied to the bottom side of said soldering strip (Ls) of said stirrup electrode (B).

* * * * *